United States Patent
Aznar et al.

(10) Patent No.: US 9,461,853 B2
(45) Date of Patent: Oct. 4, 2016

(54) METHOD AND DEVICE TO CONTROL THE GAIN OF A RADIO RECEIVER

(71) Applicant: ERICSSON MODEMS SA, Le Grand-Saconnex (CH)

(72) Inventors: Jean-Marc Aznar, Carros (FR); Stefania Sesia, Roquefort les Pins (FR); Laurent Noel, Laval (CA)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 14/562,890

(22) Filed: Dec. 8, 2014

(65) Prior Publication Data

US 2015/0215141 A1    Jul. 30, 2015

Related U.S. Application Data

(63) Continuation of application No. 13/127,941, filed as application No. PCT/EP2009/064671 on Nov. 5, 2009, now Pat. No. 8,934,584.

(30) Foreign Application Priority Data

Nov. 7, 2008    (EP) .................................... 08305787

(51) Int. Cl.
*H04L 27/08* (2006.01)
*H03G 3/30* (2006.01)
(Continued)

(52) U.S. Cl.
CPC ............ *H04L 27/08* (2013.01); *H03G 3/3078* (2013.01); *H03G 3/3089* (2013.01); *H04L 27/06* (2013.01); *H04L 27/156* (2013.01)

(58) Field of Classification Search
CPC .. H03G 3/3052; H03G 3/001; H03G 3/3078; H03G 3/3068; H03G 3/002; H03G 3/02; H03G 2201/103; H03G 3/20; H03G 3/3021; H03G 3/301; H04L 27/2647; H04L 27/156; H04L 27/06; H04L 27/08; H04L 1/02; H04L 1/20; H04W 52/05; H04W 52/52;

H03F 1/025; H03F 2200/435; H03F 2200/78; H03F 3/602; H03F 3/62; H04B 1/1027; H04B 17/318; H04B 17/20; H04B 1/26
USPC ............ 455/232.1, 245.1, 138, 247.1, 240.1; 375/347, 349, 267, 345
See application file for complete search history.

(56) References Cited

U.S. PATENT DOCUMENTS

| 4,870,370 A | 9/1989 | Hedberg et al. |
| 6,959,055 B2 | 10/2005 | Litwin, Jr. et al. |

(Continued)

FOREIGN PATENT DOCUMENTS

| EP | 1521565 A | 5/2005 |
| GB | 2216353 A | 10/1989 |

(Continued)

OTHER PUBLICATIONS

Lane, F. et al. "A Single Chip Demodulator for 64/256 QAM", Nov. 1, 1996; vol. 42, No. 4, pp. 1003-1010.

(Continued)

*Primary Examiner* — Rahel Guarino
(74) *Attorney, Agent, or Firm* — Leffler Intellectual Property Law, PLLC

(57) ABSTRACT

An automatic gain control (AGC) method and system for a radio receiver are proposed in which the ACG comprises two AGC loops; a first loop controlling signal gain in the analogue portion of the radio receiver, a second loop controlling gain in the digital domain after digitization of the received signal. The analogue AGC loop has a slower response time than the digital AGC loop. When applied to a multi-branch diversity receiver, each branch has its own digital AGC loop, but the analogue gain can be common to all branches, based on measurement of the analogue signal in each branch.

22 Claims, 4 Drawing Sheets

(51) Int. Cl.
*H04L 27/06* (2006.01)
*H04L 27/156* (2006.01)

(56) References Cited

U.S. PATENT DOCUMENTS

| | | | |
|---|---|---|---|
| 7,088,975 B1* | 8/2006 | Gomez | H03F 1/26 |
| | | | 330/124 R |
| 7,995,684 B2 | 8/2011 | Montojo et al. | |
| 8,934,584 B2* | 1/2015 | Aznar et al. | 375/345 |
| 2003/0152173 A1 | 8/2003 | Strolle et al. | |
| 2003/0194981 A1* | 10/2003 | Rimini | H03G 3/3068 |
| | | | 455/234.1 |
| 2003/0199264 A1 | 10/2003 | Holenstein et al. | |
| 2004/0151264 A1 | 8/2004 | Montojo | |
| 2005/0208916 A1 | 9/2005 | Peterzell et al. | |
| 2008/0273636 A1 | 11/2008 | Zhu | |
| 2011/0007780 A1* | 1/2011 | Shimoni | H03G 3/3068 |
| | | | 375/136 |

FOREIGN PATENT DOCUMENTS

| | | |
|---|---|---|
| JP | 2004072361 A | 3/2004 |
| JP | 2006517770 A | 7/2006 |
| WO | 2004006476 A | 1/2004 |

OTHER PUBLICATIONS

Patent Cooperation Treaty International Search Report and Written Opinion, Jan. 27, 2010, in PCT/EP2009/064671, pp. 1-10.

* cited by examiner

METHOD AND DEVICE TO CONTROL THE GAIN OF A RADIO RECEIVER

CROSS REFERENCE TO RELATED APPLICATIONS

This application is a continuation of U.S. application Ser. No. 13/127,941, filed Jul. 28, 2011 (35 U.S.C. §371(c) date), which is the National Stage of International Application No. PCT/EP2009/064671, filed Nov. 5, 2009, which claims priority under 35 U.S.C. §119 to European Patent Application No. EP 08305787.7, filed on Nov. 7, 2008. U.S. application Ser. No. 13/127,941 and European Patent Application No. EP 08305787.7 are both hereby incorporated herein by reference in their entireties.

The present disclosure relates to signal processing in radio receivers and in particular to an automatic gain control (AGC) system and method in which the effects of DC current transients on system performance are reduced.

Reception of radio signals in a radio apparatus configured therefore and down converting the desired receiving signal from the radio frequency (RF) band into the baseband can generally be done in different ways. A common way is to convert the RF signal down to an intermediate frequency (IF) and in a second step to convert the resulting signal down into the baseband. The converting operation is usually done by a well-known mixing operation with a suitable mixing frequency. For cost reduction, in zero IF receivers, which are broadly used in wireless systems, down conversion from the RF receiving signal to the baseband is done directly without the intermediate frequency step. One drawback in zero-IF receivers is the presence of a residual direct current (DC) offset after the down conversion of the receiving signal, wherein self-mixing of the local oscillators and/or second order intermodulation of the employed mixers creates DC offsets in the baseband signal. Further, even-order distortions may convert strong interfering signals to baseband. Furthermore, 1/f noise being inherent in all semiconductor devices and being inversely proportioned to the frequency (f) may mask the baseband signal. Moreover, direct conversion receivers put high demands on the baseband signal processing components because gain control and filtering must be done at baseband frequency range.

In modern receiver architectures, the analog RF receiving signal is converted from the analog domain into the digital domain for further processing, since digital signal processing is available with high performance and at low cost. In order to match the signal dynamics required by the system before and after the used analogue-to-digital converters (ADC), an automatic gain control (AGC) system could be used for control of amplification gain for the receiving signal in the one or more signal amplifiers located in the reception path.

The DC offset may be quite large causing saturation of the ADC, e.g. leading to loss of dynamics, and other problems in the receiver. To cope with these effects, so called DC offset compensation circuits are generally employed in the reception (RX) path of radio receivers. Basically, a simple example for DC offset cancellation is application of capacitors, connected in series into the signal path and thus blocking propagation of DC signals. A more complex approach is an active high pass filter configured to remove the unwanted DC components inherent to self-mixing products.

Usually, AGC is implemented by a respective gain control algorithm. Due to the digital nature of most AGC systems, also the analogue gain, i.e. in the receiving path before the ADC, is adjusted by changing the gain of the respective amplifiers in a stepwise manner, i.e. the gain is controlled in discrete gain steps. However, switching of the gain in the signal path generates DC transients in the DC offset, which from a frequency spectrum point of view contain higher frequency components, which cannot be filtered or cancelled by the DC offset compensation or cancellation circuits.

Thus, even that the DC compensation is permanently active, DC transients occur at gain step transitions; every time these gain steps are toggled. Moreover, these transients are heavily RF architecture dependent. Their settling time and peak voltage depend on a variety of RF IC architecture parameters, such as the impedance of the receiving gain chain, the location of the AGC loops with regards to amplifier gain locations and the weight of the gain step.

For instance, link level simulations for UMTS release 5, HSDPA, have shown that DC transients in the order of the frame rate caused by the AGC loop degrade the throughput versa system performance of baseband (BB) integrated circuit (IC), e.g. the signal to noise ratio (SNR).

U.S. 2005/0208916 A1 discloses a direct down conversion receiver architecture comprising a digital variable gain amplifier (DVGA), an automatic gain control (AGC) loop to provide gain control for the DVGA and RF/analog circuitry, and a serial bus interface (SBI) unit to provide controls for the RF/analog circuitry via a serial bus.

U.S. 2003/0199264 A1 discloses a system and method for a fast acquiring DC offset cancellation by increasing high pass loop bandwidth and adjusting DC offset levels at baseband. Afterwards the high pass loop bandwidth is decreased in order to fine-tune the previous estimate and to remove small variation in DC.

In view of the foregoing, a method and a system are proposed allowing a reduction of effects of DC current transients on receiver system performance.

According to a first aspect, an automatic gain control system for a radio receiver is proposed, this system having at least one receiving signal path with an analogue and a digital portion.

According to a general feature, the AGC system comprises at least two AGC loops, wherein at least one first AGC loop is configured to control the gain of at least one signal amplifier in the analogue portion of the receiver and has a first cycle time; wherein at least one second AGC loop is configured to control signal amplification of at least one signal processing unit in the digital portion of the receiver and has a second cycle time, and wherein the second cycle time is shorter than the first cycle time.

In certain embodiments, the first cycle time is by orders of magnitude longer than the second cycle time.

In other embodiments, for example if there is no frequent variation of signal reception conditions expected, the first cycle time might not be used at all, but only actually appearing variation of reception conditions lead to a gain control in the analogue portion of the receiver.

In certain embodiments the radio receiver is a multi-branch receiver, which comprises a plurality of generally similar receiving signal paths, each path being equipped with at least two AGC loops, i.e. at least one arranged in the analogue portion and the at least one other arranged in the digital portion of the respective receiving signal paths of the receiver.

Accordingly, according to another feature of the AGC, the radio receiver is a multi-branch receiver having at least two parallel receiving signal paths, each receiving signal path comprises at least one first Automatic Gain Control loop and at least one second Automatic Gain Control loop.

In certain embodiments, the arrangement of the multi-branch receiver may be part of a diversity receiver, which operates several antennas for enhancing signal reception capability.

In a further development, the gain of the receiving signal amplification in the analogue portion of each receiving signal path is set or controlled by means of the same gain control signal. For example, in a dual branch diversity receiver, each branch has its own digital AGC loop, but the analogue gain can be arranged as common for both branches, based on measurement of the analogue signal in each branch. This advantageously enables reduction of hardware and firmware (FW) or software (SW), i.e. the embedded code in the baseband, complexity and thus reduces e.g. costs and weight.

The basic idea of the AGC system resides in the perception that DC transients due to gain step transitions in the analog AGC system in radio receivers reduce system performance. The present disclosure provides an improved AGC system and a respective AGC method, by which susceptibility of radio receivers to such DC transients is remarkably reduced. This is achieved by combining at least two AGC loops in the radio receiver signal path, where a first loop is arranged for controlling gain in the analogue domain of the receiver and a second loop is arranged for controlling gain in the digital domain after A/D conversion, i.e. digitization of the received signal. By configuring the analogue AGC loop with a substantial slower cycle time than the digital AGC loop, the occurrence of DC transients can be effectively reduced.

For example, the system is located in a receiving signal path of a mobile communication device or a mobile station.

The mobile communication device or station may thus comprise a receiver for at least one of a wireless communication systems, wireless local loops, wireless LAN applications, and/or cellular systems in accordance with at least one of the following communication standards UMTS, WCDMA, UTRATDD, UTRAFDD, TDSCDMA, CDMA2000, and OFDMA.

For example, the mobile communication device or station is a device capable for High Speed Downlink Packet Access.

According to a second aspect, it is herby proposed a method for Automatic Gain Control (AGC) in a radio receiver having at least one receiving signal path with an analogue and a digital portion, the method comprising
at least one first amplifying step, in which an analogue receiving signal is amplified in the analogue portion,
digitizing the amplified analogue receiving signal into a digitized receiving signal;
at least one second amplifying step, in which the digitized receiving signal is amplified in the digital portion,
controlling a first gain for said first amplifying step based on a first cycle time ($t1$), and
controlling a second gain for said second amplifying step based on a second cycle time ($t2$),
wherein the second cycle time is shorter than first cycle time.

According to another feature, the method comprises processing of several receiving signals in a multi-branch receiver having at least two parallel receiving signal paths, the step of controlling the first gain comprising determining one common gain control value in each branch.

For example the second cycle time is by orders of magnitude shorter than the first cycle time.

The method may further comprise controlling the first gain independently of the first cycle time based on determining if there is a predetermined change in receiving conditions.

According to a further aspect, it is hereby proposed a computer program comprising program instructions, which, when performed on a programmable processor, cause the processor to perform the steps of a method as defined above.

Preferred embodiments and further developments of the present disclosure arc defined in the dependent claims of the independent claims. It shall be understood that the apparatus and the method of the present disclosure have similar and/or identical preferred embodiments and advantages.

These and other aspects will be apparent from and elucidated with reference to the embodiment(s) described hereinafter. In the following drawings, the figures are schematically drawn and not true to scale, and identical reference numerals in different figures, if any, may refer to corresponding elements. It will be clear for those skilled in the art that alternative but equivalent embodiments are possible without deviating from the true inventive concept.

The higher the update rate of an AGC loop controlling gain in an analogue portion of a transfer path, the higher is the occurrence or frequentness of DC transients caused by change of the amplification gain of the received analogue signal containing DC offset.

The present disclosure proposes an improvement to the AGC system and respective AGC method in a radio receiver aiming on a significant reduction of such DC transients in the receiving signal.

This is accomplished by, basically, employing at least two separate AGC loops in the radio receiver signal path. The at least one first AGC loop is configured to control solely signal amplification in the analogue portion of the signal path. According to the herein presented solution, a first cycle rate of the first AGC loop defines the time span between two possible amplification adaptations, i.e. between two possible DC transients. Preferably, the first cycle time is predefined in order to match particular system requirements. For example, the cycle time can be made dependent on the propagation conditions. That is to say, the system may be configured to adapt the cycle time automatically to a predetermined longer value if propagation conditions are static or to a predetermined shorter value in case of multi-path fading conditions. For instance, for the assumption of 3G UMTS environment, under multi-path fading conditions, e.g. two path with about 3 km/h, as cycle time of one UMTS frame, i.e. 10 ms, or one slot, i.e. 667 ms, may be used. Further, for static propagation conditions a cycle time of 20 UMTS frames, i.e. 200 ms, or even more may be applied.

The at least one second AGC loop is configured to control signal amplification in the digital portion of the signal path. According to the herein presented solution, this second AGC loop has a second cycle time, which is defined independently from the first cycle time. According to the present disclosure, the analogue first AGC loop has a substantial longer cycle time than the second digital AGC loop.

Figure 1:
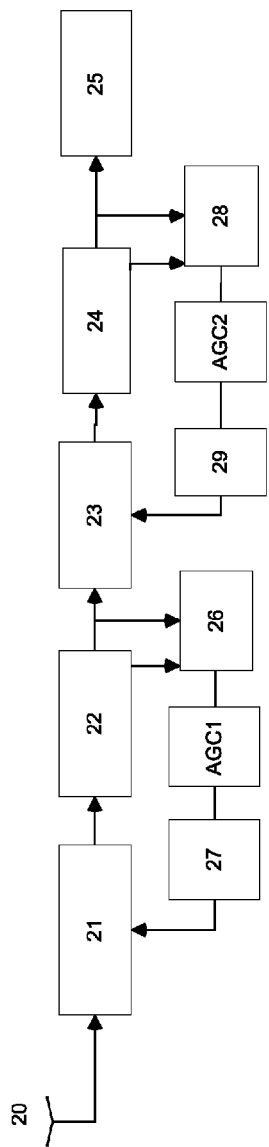
FIG. 1 illustrates an example of a signal path in an embodiment of radio receiver of the first aspect.

FIG. 1 illustrates a schematic block diagram of a receiving signal path of a radio receiver in accordance with a first embodiment. An antenna 20, for reception of a radio frequency signal of interest, is followed by a radio frequency (RF) receiving signal amplifier 21, e.g. a low noise amplifier (LNA). The amplifier 21 is followed by an analogue to digital converter (ADC) 22.

After the ADC 22, the receiving signal passes a filter 23, e.g. a raised cosine filter (RRC) filter, and a scaler 24 before supplied to an equalizer 25.

Based on the output of the ADC 22, a Pre-Filter RRSS detector 26, detects the signal level of the output of the ADC 22 and/or receives an output of the ADC 22 which indicates if the ADC 22 is saturated by the input signal. Pre-(filter)-RRSS detector 26 is configured to measure the relative receive signal strength (RRSS) of the received (Rx) I/Q baseband signal. Detector 26 measures the I/Q signal received after the ADC 22 as AGC analog loop related measurement, and thus named Pre-RRSS or Pre-RRC (with reference to the RRC filter). The detector 26 provides an input signal to a slow first AGC loop AGC1. The slow first AGC loop AGC1 operates a serial peripheral interface SPI RF, e.g. a 3-wire bus which vehicles the control words for the radio transceiver, control 27 controlling the radio frequency amplifier 21 by a first gain control signal G1.

After the scaler 24 is a post-(filter)-RRSS detector 28, which provides an input signal to a fast second ACC loop ACC2. Again the post-(filter)-RRSS detector is configured to measure the Rx digital I/Q baseband signal strength received after the scaler 24. Detector 28 measures the root-raised cosine filtered baseband signal as AGC digital loop related measurement, thus also named post-RRSS or post-RRC (with reference to the RRC filter). The fast second AGC loop AGC2 controls the digital implemented gain in the scaler 24 by a gain control signal G2.

Figure 2:
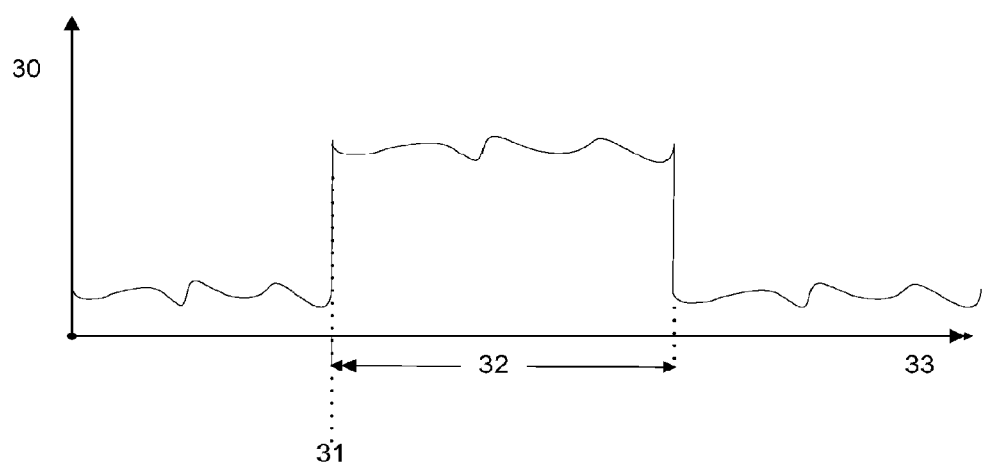
FIG. 2 shows a time diagram, illustrating DC offset variation during a gain adjustment operation by the Automatic Gain Control (AGC), causing DC transients.

Referring now to FIG. 2 the principle of DC offset compensation timing is discussed. FIG. 2 shows a schematic timing diagram, illustrating varying DC offset current 30 in a radio receiver with a stepwise gain control. At a first point in time 31 the analogue signal amplification is toggled boosting the DC share of the signal. This boost contains according to Fourier analysis a large plurality of frequencies not originating from and not associated with the received signal but now propagated via the same transfer path leading to interference and noise.

Further, until the existing DC offset compensation means lower the DC offset current, during time span 32 electric power is wasted, signal dynamic is reduced and generally unwanted heat is produced within the device. Depending on characteristics of the existing DC offset compensation means the graph may look different and thus the impact to the signal may also differ from that depicted in FIG. 2. Nevertheless, the discussed effects generally exist and applying the present teaching can reduce their occurrence frequency.

Figure 3:
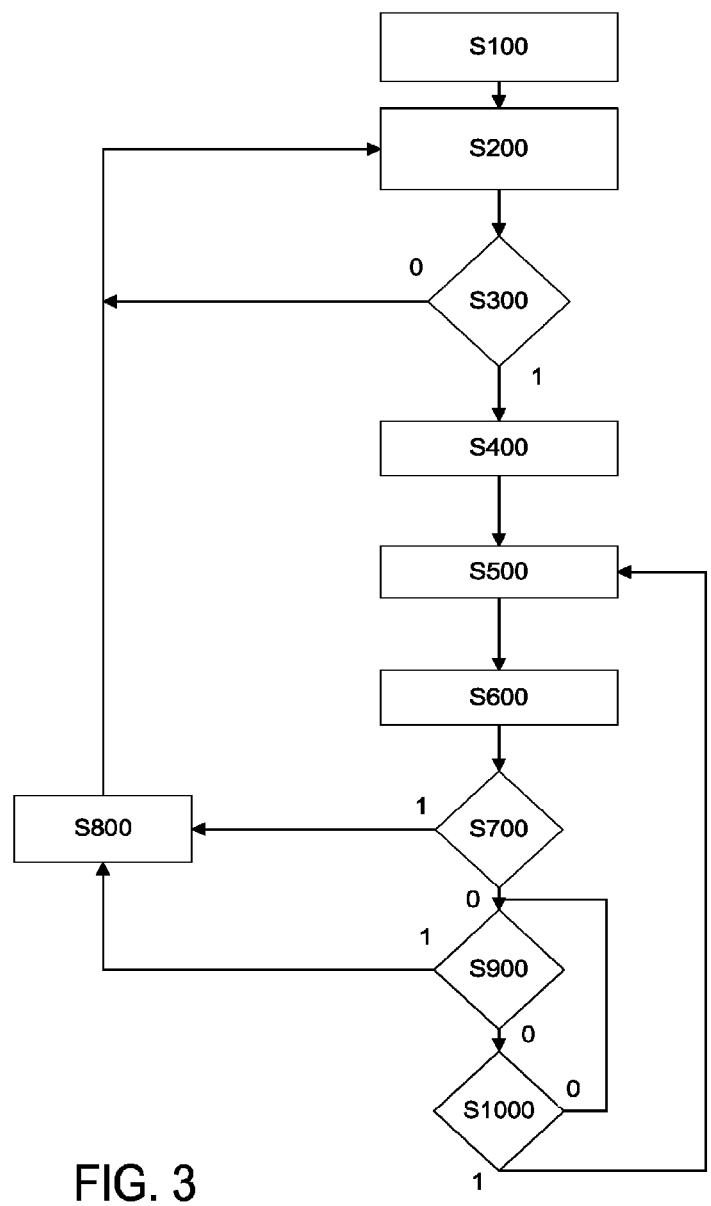
FIG. 3 is a flow chart illustrating the processing of two AGC loops.

Now with reference to FIG. 3, the operation of the AGC system will be explained in more detail. Thus, FIG. 3 shows a flow chart of the AGC method, which can be implemented in a respective radio receiver. Note, in the flow chart at steps where a condition is checked, "0" corresponds to "NO" and "1" corresponds to "YES".

It goes without saying that the method steps described in the following can be implemented by means of a programmable processor, where the method steps are coded by means of program code instructions, which when run on the processor, cause the processor to perform the steps of the AGC method.

At the beginning of the AGC algorithm, at step S100, a timer T1 is started for the first cycle rate or time for control of the first analogue AGC loop, i.e. the slow AGC loop AGC1.

The signal gain in at least one amplifier located in the analogue portion of the receiving signal path is adjusted in step S200 in accordance with a certain criteria, e.g. such as based on the result of checking whether the ADC 22 is saturated or not.

Then, in step S300 it is judged whether the amplified receiving signal is in the dynamic range of the receiver or not. If not, the procedure returns to step S200, where a gain adjustment is done. That is to say, the adjustment loop is passed until analogue signal gain matches the dynamic range of the receiver.

Now, until further notice, in step S400 the first analogue AGC loop is deactivated. Hence, no further DC transients will be generated in the analog domain.

Next, in step S500 a second timer T2 for timing of the second cycle rate or time of the second digital AGC loop AGC2 is started.

In step S600 the signal gain in at least one unit of the digital portion of the receiving signal path is adjusted. In the following step S700 a check is done whether in the meantime an important or significant change in the receiving conditions of the receiving signal has happened, which cannot be coped with by the second digital AGC loop alone. Thus, a gain adjustment is required in the first analog AGC loop, i.e. in the analogue portion of the radio receiver.

If so (YES), the procedure goes to step S800, where the analogue AGC loop is reactivated again.

In the other case (NO), the status of the first timer T1 is checked in step S900. If the first timer T1 has expired (YES), i.e. the first cycle time period is over, the procedure continues at step S800. In other words, the analogue AGC loop is reactivated again in step S800 regardless of the actual set gain control value G1.

If the first timer T1 has not expired (NO), then in step S1000 the second timer T2 is checked. In the case that the second timer T2, i.e. the second cycle time period is over (YES), the second digital AGC loop is recurred by a return of the AGC procedure to step S500.

If the second timer T2 has not expired (NO), then the AGC procedure goes to step S900 and the first timer T1 is again checked in step S900.

It should be noted that FIG. 3 in connection with the description above illustrates only one particular embodiment by way of an example. It goes without saying, that the herein disclosed principle can be varied or modified without deviating from the scope of the present disclosure. For instance, the timer T1 could be left and only one time could be used for both AGC loops, implemented by a central AGC control unit. Then, only detection of an important change in reception conditions would return the algorithm back into the analogue gain adjustment in steps S200 and S300. Also disabling S400 and enabling S800 the analogue AGC loop could be dropped without departing from the herein described principle.

In further development the herein disclosed AGC system can be implemented into each branch of a multi-branch radio receiver, e.g. such as a diversity receiver. In this case, each receiving signal path or branch between one antenna 20 or more antennas and the equalizer 25 comprises the at least two separate AGC loops which operate independently of one another. Such an application of the AGC system and method is in particular useful for spatial diversity reception.

Moreover, in still another further development, the receiver comprises at least two parallel receiving signal paths, where the respective at least two analogue amplifiers in each receiving signal branch may be controlled by one single, i.e. common, amplification gain control signal or factor, respectively, based on measurement of the analogue signal in each branch or path.

Figure 4:
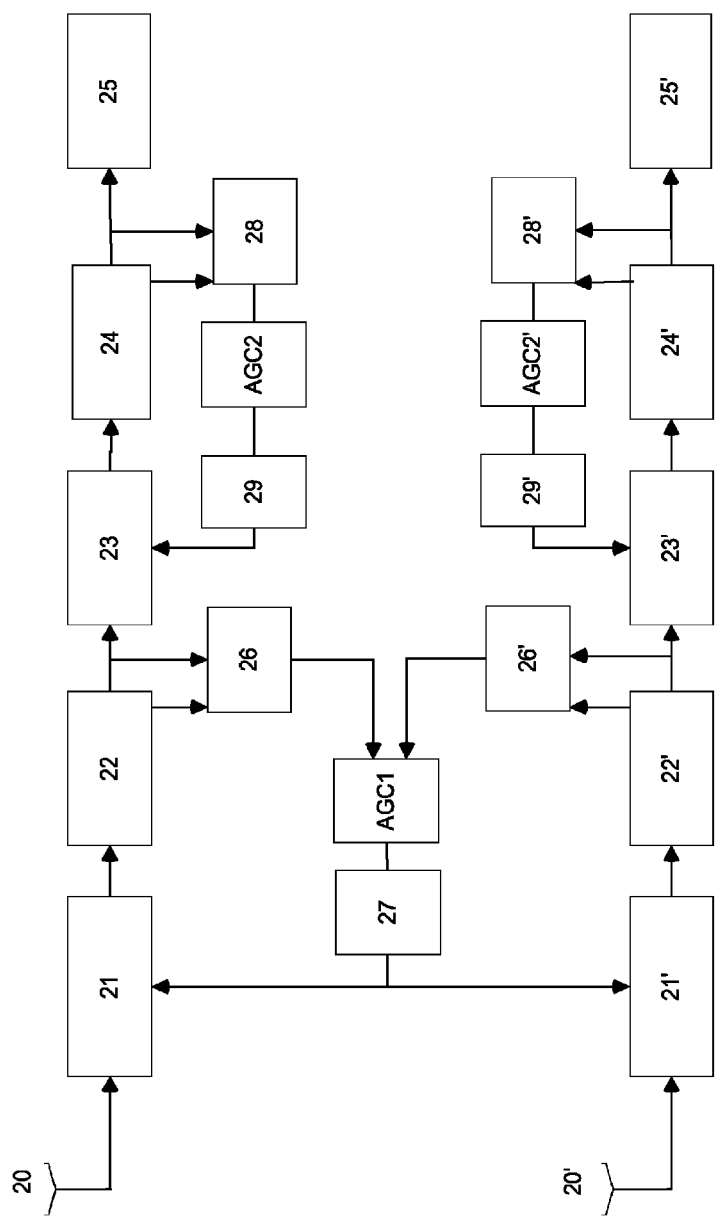
FIG. 4 shows a further embodiment of a radio receiver applied to a dual-branch receiver.

FIG. 4 shows an embodiment of such multi-branch receiver architecture as a further development, where two basically identical receiving signal branches or paths, as illustrated in FIG. 1, are arranged in parallel. The receiving signal branches and share parts of the first analog AGC loop. That is to say, the first automatic gain control AGC1 is a common entity located in the analogue portion and the SPI RF control 27 controls amplification of both receiving signal paths. The other elements of the two branches remain separate and keep operating independently, i.e. the operation is in principle the same as described in connection with FIGS. 1 to 3.

Accordingly, hardware (HW) complexity can be reduced regarding not only the number of HW pins, but also by reducing the digital RF control interface and FW or SW complexity. For instance, only two sets of three wire-buses, i.e. six control lines altogether are required. Thus, the novel AGC architecture allows simplification of the HW RF-Bbi interface of a HSDPA system, where by means of a single common three wire bus may be used to control the two radios. In preferred embodiments the present disclosure is implemented in a mobile station. As mentioned above particularly wireless devices comprising zero-IF receivers benefit from efficient DC offset compensation. Especially battery powered devices benefit from reduced power looses by DC offset compensation. Thus battery life cycles and user's mobility are not unnecessarily shortened.

Possible applications for the present principle are in receivers for wireless communication systems, including wireless local loops, wireless LAN applications, and cellular systems such as 3G UMTS, i.e. Wideband Code Division Multiple Access (WCDMA) both UMTS Terrestrial Radio Access Time Division Duplex (UTRATDD) and UMTS Terrestrial Radio Access Frequency Division Duplex (UTRAFDD), Time Division-Synchronous Code Division Multiple Access (TDSCDMA), CDMA2000, Orthogonal Frequency Division Multiple Access (OFDMA) systems. These receivers are common in mobile stations being capable of operating in cellular communication networks.

It shall be appreciated, that examples and embodiments of the present disclosure discussed above shall only aid in understanding and using the above description and many variations will be apparent to those skilled in the art that can be applied without departing from the scope of this disclosure as defined in the appended claims.

While the disclosure has been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those skilled in the art in practicing the disclosure, from a study of the drawings and the appended claims. In the claims, the word "comprising" does not exclude other elements or steps, and the indefinite article "a" or "an" does not exclude a plurality. A single means or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. An Automatic Gain Control system for a radio receiver having at least one receiving signal path with an analogue and a digital portion, the Automatic Gain Control system comprising:
   at least two Automatic Gain Control loops;
   wherein at least one first Automatic Gain Control loop comprises a first AGC circuit and is configured to initially control the gain of at least one signal amplifier located in the analogue portion of the receiver and thereafter to control the gain of the at least one signal amplifier located in the analogue portion of the receiver only upon detection of a change in reception conditions that satisfies predetermined criteria;
   wherein at least one second Automatic Gain Control loop comprises a second AGC circuit and is configured to control the signal amplification of the at least one signal processing unit in the digital portion of the receiver; and
   wherein the digital portion of the receiver operates on a digitized receiving signal that is a digitized form of an amplified analogue receiving signal produced by the analogue portion of the receiver.

2. The system according to claim 1,
   wherein the radio receiver is a multi-branch receiver having at least two parallel receiving signal paths, and
   wherein each receiving signal path comprises at least one first Automatic Gain Control loop and at least one second Automatic Gain Control loop.

3. The system according to claim 2,
   wherein in each receiving signal path the at least one first Automatic Gain Control loop is set by means of the same gain control signal.

4. The system according to claim 1,
   wherein the system is located in a receiving signal path of a mobile communication device or a mobile station.

5. The system according to claim 4,
   wherein the mobile communication device or station comprises a receiver for at least one of a wireless communication systems, wireless local loops, wireless LAN applications, and/or cellular systems in accordance with at least one of the following communication standards UMTS, WCDMA, UTRATDD, UTRAFDD, TDSCDMA, CDMA2000, and OFDMA.

6. The system according to claim 4,
   wherein the mobile communication device or station is a device capable for High Speed Downlink Packet Access.

7. The Automatic Gain Control system of claim 1, wherein the predetermined criteria include a detection that the change in reception conditions cannot be coped with solely by controlling a signal amplification of at least one signal processing unit in the digital portion of the receiver.

8. The Automatic Gain Control system of claim 1, wherein the at least one first Automatic Gain Control loop is configured to periodically detect whether the change in reception conditions cannot be coped with solely by controlling the signal amplification of the at least one signal processing unit in the digital portion of the receiver.

9. The Automatic Gain Control system of claim 1, wherein:
   the second Automatic Gain Control loop has a second cycle time; and the at least one first Automatic Gain Control loop is configured to periodically detect, at a rate based on the second cycle time, whether the change in reception conditions cannot be coped with solely by controlling the signal amplification of the at least one signal processing unit in the digital portion of the receiver.

10. A method for Automatic Gain Control (AGC) in a radio receiver having at least one receiving signal path with an analogue and a digital portion, the method comprising:
at least one first amplifying step, in which an analogue receiving signal is amplified in the analogue portion, wherein the analog portion comprises a first AGC circuit in a first feedback loop;
digitizing the amplified analogue receiving signal into a digitized receiving signal;
at least one second amplifying step, in which the digitized receiving signal is amplified in the digital portion, wherein the digital portion comprises a second AGC circuit and a second feedback loop;
initially controlling a first gain for said first amplifying step and thereafter controlling the first gain for said first amplifying step only upon detection of a change in reception conditions that satisfies predetermined criteria; and
controlling the second gain for said second amplifying step.

11. The method according to claim 10,
wherein the method comprises processing of several receiving signals in a multi-branch receiver having at least two parallel receiving signal paths, and
wherein the step of controlling the first gain comprises determining one common gain control value in each branch.

12. The method of claim 10, wherein the predetermined criteria include a detection that the change in reception conditions cannot be coped with solely by controlling a second gain for said second amplifying step.

13. The method of claim 10, comprising:
periodically detecting whether the change in reception conditions cannot be coped with solely by controlling a second gain for said second amplifying step.

14. The method of claim 13, wherein:
controlling the second gain for said second amplifying step is based on a second cycle time; and
periodically detecting whether the change in reception conditions cannot be coped with solely by controlling the second gain for said second amplifying step is performed based on the second cycle time.

15. A nontransitory processor-readable storage medium comprising program instructions that, when performed on a programmable processor, cause the programmable processor to perform a method for Automatic Gain Control (AGC) in a radio receiver having at least one receiving signal path with an analogue and a digital portion, the method comprising:
at least one first amplifying step, in which an analogue receiving signal is amplified in the analogue portion, wherein the analog portion comprises a first AGC circuit in a first feedback loop;
digitizing the amplified analogue receiving signal into a digitized receiving signal;
at least one second amplifying step, in which the digitized receiving signal is amplified in the digital portion, wherein the digital portion comprises a second AGC circuit and a second feedback loop;
initially controlling a first gain for said first amplifying step and thereafter controlling the first gain for said first amplifying step only upon detection of a change in reception conditions that satisfies predetermined criteria; and
controlling the second gain for said second amplifying step.

16. The nontransitory processor-readable storage medium of claim 15, wherein the predetermined criteria include a detection that the change in reception conditions cannot be coped with solely by controlling a second gain for said second amplifying step.

17. The nontransitory processor-readable storage medium of claim 15, wherein the method comprises:
periodically detecting whether the change in reception conditions cannot be coped with solely by controlling a second gain for said second amplifying step.

18. The nontransitory processor-readable storage medium of claim 17, wherein:
controlling the second gain for said second amplifying step is based on a second cycle time; and
periodically detecting whether the change in reception conditions cannot be coped with solely by controlling the second gain for said second amplifying step is performed based on the second cycle time.

19. An Automatic Gain Control (AGC) system for a radio receiver having at least one received signal path with a first portion having an output coupled to an input of a second portion, wherein the first portion comprises a first signal amplifier and the second portion comprises a second signal amplifier, the Automatic Gain Control system comprising:
a first AGC circuit comprising:
a detector configured to receive an output signal of the first portion and to detect a signal reception condition based on the output signal of the first portion; and
circuitry coupled to receive a detection output from the detector and configured to initially control a gain of the first signal amplifier located in the first portion of the receiver and thereafter to control the gain of the first signal amplifier in response to detection of a change in reception conditions that satisfies predetermined criteria,
wherein the predetermined criteria include the change in reception conditions being of a magnitude such that the change in reception conditions cannot be coped with by a second AGC circuit that controls a gain of the second signal amplifier.

20. An Automatic Gain Control (AGC) system for a radio receiver having at least one received signal path with a first portion having an output coupled to an input of a second portion, wherein the first portion comprises a first signal amplifier and the second portion comprises a second signal amplifier, the Automatic Gain Control system comprising:
a first AGC circuit comprising:
a detector configured to receive an output signal of the first portion and to detect a signal reception condition based on the output signal of the first portion; and
circuitry coupled to receive a detection output from the detector and configured to initially control a gain of the first signal amplifier located in the first portion of the receiver and thereafter to control the gain of the first signal amplifier in response to detection of a change in reception conditions that satisfies predetermined criteria,
wherein the first AGC circuit further comprises circuitry configured to control the gain of the first signal amplifier in response to a detection that a first cycle time period has expired.

21. A radio receiver having at least one receiving signal path with a first portion having an output coupled to an input of a second portion, wherein the first portion comprises a first signal amplifier and the second portion comprises a second signal amplifier, the radio receiver comprising:
- a detector configured to detect a signal reception condition; and
- an Automatic Gain Control system,
- wherein the Automatic Gain Control system comprises:
  - a first AGC circuit comprising:
    - circuitry coupled to receive a detection output from the detector and configured to initially control a gain of the first signal amplifier located in the first portion of the receiver and thereafter to control the gain of the first signal amplifier in response to detection of a change in reception conditions that satisfies predetermined criteria,
- wherein the predetermined criteria include the change in reception conditions being of a magnitude such that the change in reception conditions cannot be coped with by the second signal amplifier.

22. A radio receiver having at least one receiving signal path with a first portion having an output coupled to an input of a second portion, wherein the first portion comprises a first signal amplifier and the second portion comprises a second signal amplifier, the radio receiver comprising:
- a detector configured to detect a signal reception condition; and
- an Automatic Gain Control system,
- wherein the Automatic Gain Control system comprises:
  - a first AGC circuit comprising:
    - circuitry coupled to receive a detection output from the detector and configured to initially control a gain of the first signal amplifier located in the first portion of the receiver and thereafter to control the gain of the first signal amplifier in response to detection of a change in reception conditions that satisfies predetermined criteria,
  - wherein the first AGC circuit further comprises circuitry configured to control the gain of the first signal amplifier in response to a detection that a first cycle time period has expired.

* * * * *

UNITED STATES PATENT AND TRADEMARK OFFICE
CERTIFICATE OF CORRECTION

PATENT NO. : 9,461,853 B2  
APPLICATION NO. : 14/562890  
DATED : October 4, 2016  
INVENTOR(S) : Aznar et al.

Page 1 of 1

It is certified that error appears in the above-identified patent and that said Letters Patent is hereby corrected as shown below:

On the Title Page

In Item (57), under "ABSTRACT", in Column 2, Line 2, delete "ACG" and insert -- AGC --, therefor.

In the Specification

In Column 1, Line 8, delete "2011" and insert -- 2011, now Pat. No. 8,934,584 --, therefor.

In Column 5, Line 9, delete "raised cosine filter (RRC)" and insert -- root raised cosine (RRC) --, therefor.

In Column 5, Line 27, delete "ACC" and insert -- AGC --, therefor.

In Column 5, Line 28, delete "ACC2." and insert -- AGC2. --, therefor.

In Column 5, Line 29, delete "1/Q" and insert -- I/Q --, therefor.

In Column 6, Line 31, delete "5800," and insert -- S800, --, therefor.

Signed and Sealed this  
Third Day of January, 2017

Michelle K. Lee  
*Director of the United States Patent and Trademark Office*